(12) United States Patent
Otake (10) Patent No.: US 7,960,782 B2
(45) Date of Patent: Jun. 14, 2011

(54) NITRIDE SEMICONDUCTOR DEVICE AND METHOD FOR PRODUCING NITRIDE SEMICONDUCTOR DEVICE

(75) Inventor: Hirotaka Otake, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/342,854

(22) Filed: Dec. 23, 2008

(65) Prior Publication Data

US 2009/0179258 A1    Jul. 16, 2009

(30) Foreign Application Priority Data

Dec. 26, 2007 (JP) ................................. 2007-334849
Mar. 28, 2008 (JP) ................................. 2008-085639

(51) Int. Cl.
    *H01L 29/66* (2006.01)
(52) U.S. Cl. ................. 257/330; 257/331; 257/E29.201
(58) Field of Classification Search .................. 257/330, 257/331, E29.201
    See application file for complete search history.

(56) References Cited

U.S. PATENT DOCUMENTS

| 4,568,958 | A  | * | 2/1986  | Baliga  | ........................... | 257/332 |
| 6,461,918 | B1 | * | 10/2002 | Calafut | ........................ | 438/270 |
| 2001/0023959 | A1 | * | 9/2001 | Harada et al. | ................ | 257/328 |
| 2003/0082860 | A1 |   | 5/2003 | Yoshida et al. | | |
| 2007/0267672 | A1 | * | 11/2007 | Hokomoto et al. | ........... | 257/301 |

FOREIGN PATENT DOCUMENTS

JP    2003-163354    6/2003

* cited by examiner

*Primary Examiner* — Jarrett J Stark
(74) *Attorney, Agent, or Firm* — Rabin & Berdo, PC (57) ABSTRACT

A nitride semiconductor device includes: a nitride semiconductor structure portion including a first layer made of an n-type group III nitride semiconductor, a second layer made of a group III nitride semiconductor containing a p-type impurity provided on the first layer and an n-type region formed on a part of the second layer, and having a wall surface extending over the first layer, a body region of the second layer other than the n-type region and the n-type region; a gate insulating film formed such that the gate insulating film is opposed to the body region on the wall surface; a gate electrode formed such that the gate electrode is opposed to the body region through the gate insulating film; a source electrode formed such that the source electrode is electrically connected to the n-type region; a drain electrode formed such that the drain electrode is electrically connected to the first layer; and a body electrode formed such that the body electrode is electrically connected to the body region.

10 Claims, 9 Drawing Sheets

NITRIDE SEMICONDUCTOR DEVICE AND METHOD FOR PRODUCING NITRIDE SEMICONDUCTOR DEVICE

BACKGROUND OF THE INVENTION

1. Field of the Invention

The present invention relates to a nitride semiconductor device using group III nitride semiconductors and a method for producing the same.

2. Description of Related Art

Conventionally, a power device using a silicon semiconductor is employed for a power amplifier circuit, a power supply circuit, a motor driving circuit or the like.

However, improvement in withstand voltage, reduction in resistance and improvement in speed of a silicon devices are now reaching the limits due to the theoretical limit of the silicon semiconductor, and it is becoming difficult to satisfy requirements of the market.

Therefore, development of a nitride semiconductor device having characteristics such as a high withstand voltage, a high-temperature operation, a high current density, high-speed switching and small on-resistance is examined.

Figure 5:
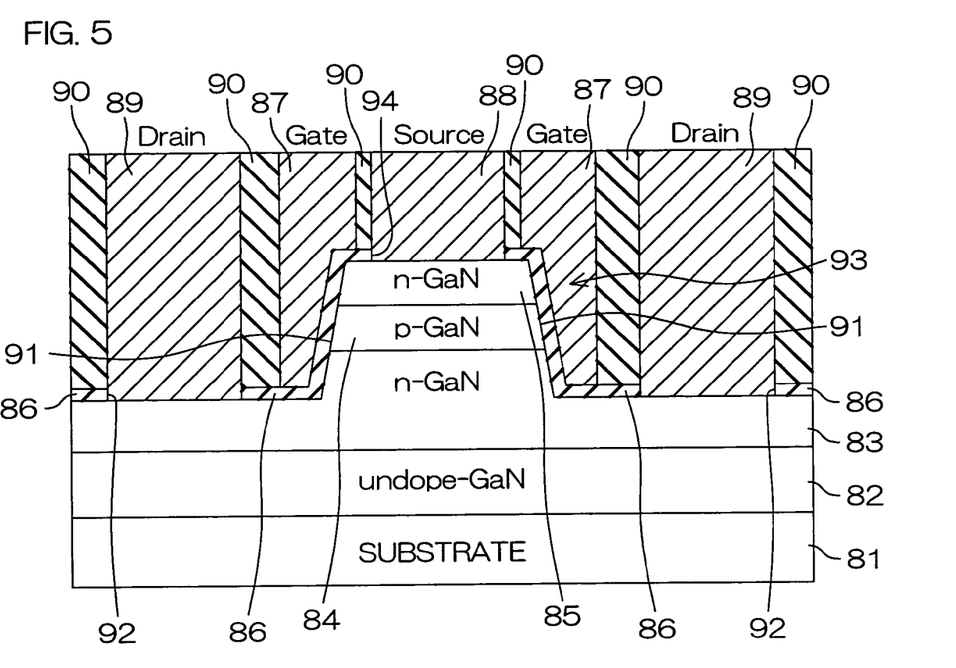
FIG. 5 is a schematic sectional view for illustrating the structure of a conventional nitride semiconductor device.

FIG. 5 is a schematic sectional view for illustrating the structure of a conventional nitride semiconductor device.

This nitride semiconductor device includes a substrate 81 and a multilayer structure portion 93 laminated on the substrate 81.

The multilayer structure portion 93 includes an undoped GaN layer 82, an n-type GaN layer 83, a p-type GaN layer 84 and an n-type GaN layer 85 successively laminated from the side of the substrate 81. Wall surfaces 91 extending over the n-type GaN layer 83, the p-type GaN layer 84 and the n-type GaN layer 85 are formed in the multilayer structure portion 93. A gate insulating film 86 covering the overall regions of the wall surfaces 91 is formed on the surface of the multilayer structure portion 93.

Openings 94 and 92 partially exposing the n-type GaN layers 85 and 83 respectively are formed in the gate insulating film 86.

A source electrode 88 is electrically connected to the portion of the n-type GaN layer 85 exposed from the opening 94. On the other hand, drain electrodes 89 are electrically connected to the portions of the n-type GaN layer 83 exposed from the openings 92. Gate electrodes 87 are formed on portions of the gate insulating film 86 opposed to the wall surfaces 91.

Interlayer dielectric films 90 are interposed between the adjacent ones of the source electrode 88, the drain electrodes 89 and the gate electrodes 87, to isolate these electrodes from one another.

The operation of the nitride semiconductor device is now described. First, a bias (reverse bias) positive on the side of the drain electrodes 89 is supplied between the source electrode 88 and the drain electrodes 89 (the source and the drain), for example. Thus, a reverse voltage is supplied to the interface (p-n junction) between the n-type GaN layer 83 and the p-type GaN layer 84, whereby the n-type GaN layer 85 and the n-type GaN layer 83, i.e., the source and the drain are cut off (reverse-biased).

When a bias exceeding a gate threshold voltage positive with reference to the potential of the source electrode 88 is applied to the gate electrodes 87 in this state, electrons are induced in portions (channel regions) of the p-type GaN layer 84 around the interfaces between the wall surfaces 91 and the gate insulating film 86, to form inversion layers (channels). The source and the drain conduct through the inversion layers.

SUMMARY OF THE INVENTION

When a bias positive on the side of the source electrode 88 is supplied to the drain electrodes 89 (when the potential of the source electrode 88 exceeds those of the drain electrodes 89) in the aforementioned nitride semiconductor device, however, an electric field may concentrate between the n-type GaN layer 85 and the p-type GaN layer 84, to break the device.

An object of the present invention is to provide a nitride semiconductor device made of group III nitride semiconductors capable of suppressing breakage of the device and a method for producing the same.

The foregoing and other objects, features and effects of the present invention will become more apparent from the following detailed description of the embodiments with reference to the attached drawings.

DETAILED DESCRIPTION OF THE INVENTION

A nitride semiconductor device according to one embodiment of the present invention comprises: a nitride semiconductor structure portion including a first layer made of an n-type group III nitride semiconductor, a second layer made of a group III nitride semiconductor containing a p-type impurity provided on the first layer and an n-type region formed on a part of the second layer and having a wall surface extending over the first layer, a body region of the second layer other than the n-type region and the n-type region; a gate insulating film formed such that the gate insulating film is opposed to the body region on the wall surface; a gate electrode formed such that the gate electrode is opposed to the body region through the gate insulating film; a source electrode formed such that the source electrode is electrically connected to the n-type region; a drain electrode formed such that the drain electrode is electrically connected to the first layer; and a body electrode formed such that the body electrode is electrically connected to the body region.

According to this structure, the nitride semiconductor structure portion is formed by providing the second layer made of the group III nitride semiconductor containing the p-type impurity on the first layer. The body region and the n-type region are formed on the second layer. Therefore, an n-p-n structure consisting of the first layer, the body region and the n-type region is formed in the nitride semiconductor structure portion.

In the nitride semiconductor structure portion, the gate insulating film is arranged to be opposed to the body region on the wall surface extending over the first layer, the body region and the n-type region. The gate electrode is opposed to the body region through this gate insulating film.

The source electrode is formed to be electrically connected to the n-type region, and the drain electrode is formed to be electrically connected to the first layer. The source electrode and the drain electrode may be in ohmic contact with the n-type region and the first layer respectively, and one or more semiconductor layers having different compositions and containing different impurities may be interposed between these electrodes and the semiconductor layers (semiconductor regions).

On the other hand, the body electrode is electrically connected to the body region of the second layer. In the nitride semiconductor device, therefore, a p-n diode is formed by the body electrode, the body region containing the p-type impurity, the n-type first layer and the drain electrode.

Therefore, the body electrode and the source electrode are so connected with each other that a current can be preferentially fed to the aforementioned p-n diode when a bias positive on the side of the source electrode is applied to the drain electrode and the potential of the source electrode exceeds that of the drain electrode.

Consequently, field concentration on the boundary (p-n junction) between the body region and the n-type region can be suppressed, whereby breakage of the nitride semiconductor device can be suppressed.

In a field-effect transistor having an n-p-n structure, positive holes (holes) may remain in a portion located immediately under a channel (a portion of a p-type semiconductor layer close to the channel) due to such impact ionization that electrons flowing in the channel collide with atoms constituting the p-type semiconductor layer during the operation of the field-effect transistor. In this case, an over current may flow to the channel to cause avalanche breakdown due to electron attraction by the residual positive holes.

According to the aforementioned structure, however, the body region of the second layer forming a channel in operation is electrically connected with the body electrode, whereby positive holes forced to a portion located immediately under the channel can be recovered from the body electrode by setting the potential of the body electrode to a proper value. Therefore, electron attraction resulting from residual positive holes can be suppressed, and avalanche breakdown can be suppressed.

A group III nitride semiconductor is a semiconductor prepared by combining a group III element and nitrogen with each other, and typical examples thereof include aluminum nitride (AlN), gallium nitride (GaN) and indium nitride (InN), which can be generally expressed as $Al_xIn_yGa_{1-x-y}N$ ($0 \leq x \leq 1$, $0 \leq y \leq 1$ and $0 \leq x+y \leq 1$).

Preferably, the second layer includes a high-concentration layer having a relatively high p-type impurity concentration provided on the first layer and a low-concentration layer having a relatively low p-type impurity concentration provided on the high-concentration layer, and the n-type region is formed on the low-concentration layer.

A p-type impurity has a deep impurity level (acceptor level). In order to prepare a p-type group III nitride semiconductor with a p-type impurity, therefore, the group III nitride semiconductor must be doped with the p-type impurity in a high concentration ($1 \times 10^{19}$ cm$^{-3}$, for example). When an n-type region is formed by doping a part of a group III nitride semiconductor having a high p-type impurity concentration with an n-type impurity, therefore, the resistance of the n-type region may be increased due to impurity scattering of the p-type impurity.

According to the aforementioned preferred structure, on the other hand, the n-type region is formed on the low-concentration layer having a relatively low p-type impurity concentration in the second layer containing the p-type impurity, whereby the p-type impurity can be inhibited from impurity scattering. Consequently, increase in the resistance of the n-type region can be suppressed.

Preferably, the nitride semiconductor device further includes a third layer, formed on a semiconductor surface portion of the body region on the wall surface, having conductivity different from that of the body region, and the gate insulating film is interposed between the third layer and the gate electrode.

According to this structure, an inversion layer (channel) is formed on the third layer, which is a region different in conductivity from the body region. When the acceptor concentration of the third layer is lower than that of the body region, therefore, a gate threshold voltage can be reduced and electron mobility can be improved as compared with a case where the inversion layer (channel) is formed on the body region. Consequently, on-resistance can be reduced, and an excellent power device can be implemented.

The third layer may be formed by changing the property of the second layer. Alternatively, the third layer may be formed by regrowing the group III nitride semiconductor from the second layer. The term "changing the property" denotes an operation of forming nitrogen vacancies in the second layer by applying plasma to the second layer or implanting ions of Si or the like into the second layer.

Preferably, the body electrode is in contact with the body region on an outermost surface parallel to the major growth surface of the nitride semiconductor structure portion.

When a group III nitride semiconductor containing a p-type impurity is etched, an n-type impurity concentration in the etched portion is generally increased due to nitrogen escape from the semiconductor surface, for example. When the body region is partially etched in the nitride semiconductor device, for example, the etched portion of the body region exhibits an n-type impurity concentration larger than that of the remaining portion.

If the body electrode is brought into contact with the portion having a large n-type impurity concentration, it is difficult to attain an excellent ohmic property between the body region and the body electrode.

According to the aforementioned preferred structure, on the other hand, the body electrode is in contact with the body region on the outermost surface parallel to the major growth surface of the nitride semiconductor structure portion. The outermost surface parallel to the major growth surface denotes a surface not subjected to a treatment such as dry etching after the growth when the nitride semiconductor structure portion is formed by epitaxy, for example.

In other words, the body electrode can be brought into contact with an untreated surface, whereby an excellent ohmic property can be attained on the junction between the body region and the body electrode. Therefore, resistance can be reduced when a current flows in the p-n diode formed by the body electrode, the body region, the first layer and the drain electrode.

Preferably, the n-type region is formed by ion implantation of an n-type impurity.

An n-type impurity can be more easily ion-implanted into a group III nitride semiconductor than a p-type impurity. Therefore, the n-type region can be prepared by forming the second layer containing the p-type impurity by a method different from ion implantation and ion-implanting the n-type impurity into the second layer. Thus, the nitride semiconductor device can be easily produced.

A method for producing a nitride semiconductor device according to one embodiment of the present invention comprises: a first layer forming step of forming a first layer made of an n-type group III nitride semiconductor; a second layer forming step of forming a second layer made of a group III nitride semiconductor containing a p-type impurity on the first layer; an n-type region forming step of forming an n-type region on a part of the second layer; a wall surface forming step of forming a wall surface extending over the first layer, a body region of the second layer other than the n-type region and the n-type region on the nitride semiconductor structure portion including the first layer, the second layer and the n-type region; a gate insulating film forming step of forming a gate insulating film to be opposed to the body region on the wall surface; a gate electrode forming step of forming a gate electrode to be opposed to the body region through the gate insulating film; a source electrode forming step of forming a source electrode to be electrically connected to the n-type region; a drain electrode forming step of forming a drain electrode to be electrically connected to the first layer; and a body electrode forming step of forming a body electrode to be electrically connected to the body region.

According to this method, the nitride semiconductor device according to one embodiment of the present invention can be produced.

The second layer forming step may include a high-concentration layer forming step of forming a high-concentration layer having a relatively high p-type impurity concentration on the first layer and a low-concentration layer forming step of forming a low-concentration layer having a relatively low p-type impurity concentration on the high-concentration layer, and the n-type region forming step may include a step of forming the n-type region on the low-concentration layer.

The method for producing a nitride semiconductor device may further include a third layer forming step of forming a third layer having conductivity different from that of the body region on a semiconductor surface portion of the body region exposed through the wall surface forming step, the gate insulating film forming step may be a step of forming the gate insulating film to be opposed to the third layer, and the gate electrode forming step may be a step of forming the gate electrode to be opposed to the third layer through the gate insulating film.

The third layer forming step may include a step of forming the third layer by changing the property of the second layer. Alternatively, the third layer forming step may include a step of forming the third layer by regrowing the group III nitride semiconductor from the body region.

Preferably, the wall surface forming step includes a step of forming a mask covering the body region and the n-type region to expose a part of the n-type region and a step of forming the wall surface by etching the nitride semiconductor structure portion through the mask, and the body electrode forming step includes a step of forming the body electrode on the portion of the body region covered with the mask.

According to this method, the body region is covered with the mask when the wall surface is formed by etching the nitride semiconductor structure portion. After the formation of the wall surface, the body electrode is formed on the portion having been covered with the mask.

As hereinabove described, the body electrode is formed on the portion other than the etched portion, i.e., the portion covered with the mask, whereby an excellent ohmic property can be attained on the junction between the body region and the body electrode.

Therefore, resistance can be reduced when a current flows in a p-n diode formed by the body electrode, the body region, the first layer and the drain electrode.

Preferably, the step of forming the mask includes a step of forming the mask by a spin-on-glass (SOG) method with $SiO_2$, a step of forming the mask by plasma CVD (Chemical Vapor Deposition) with $SiO_2$, or a step of forming the mask by ECR (Electron Cyclotron Resonance) sputtering with $SiO_2$, for example. According to the aforementioned method, the mask can be formed with small damage on the n-type region and the body region.

Preferably, the n-type region forming step includes a step of ion-implanting an n-type impurity into the second layer.

As hereinabove described, an n-type impurity can be more easily ion-implanted into a group III nitride semiconductor than a p-type impurity. Therefore, the second layer having the body region and the n-type region can be easily formed by forming the second layer containing the p-type impurity by a method different from ion implantation and ion-implanting the n-type impurity into the second layer. Consequently, the nitride semiconductor device can be easily produced.

Embodiments of the present invention are now described in more detail with reference to the attached drawings.

Figure 1:
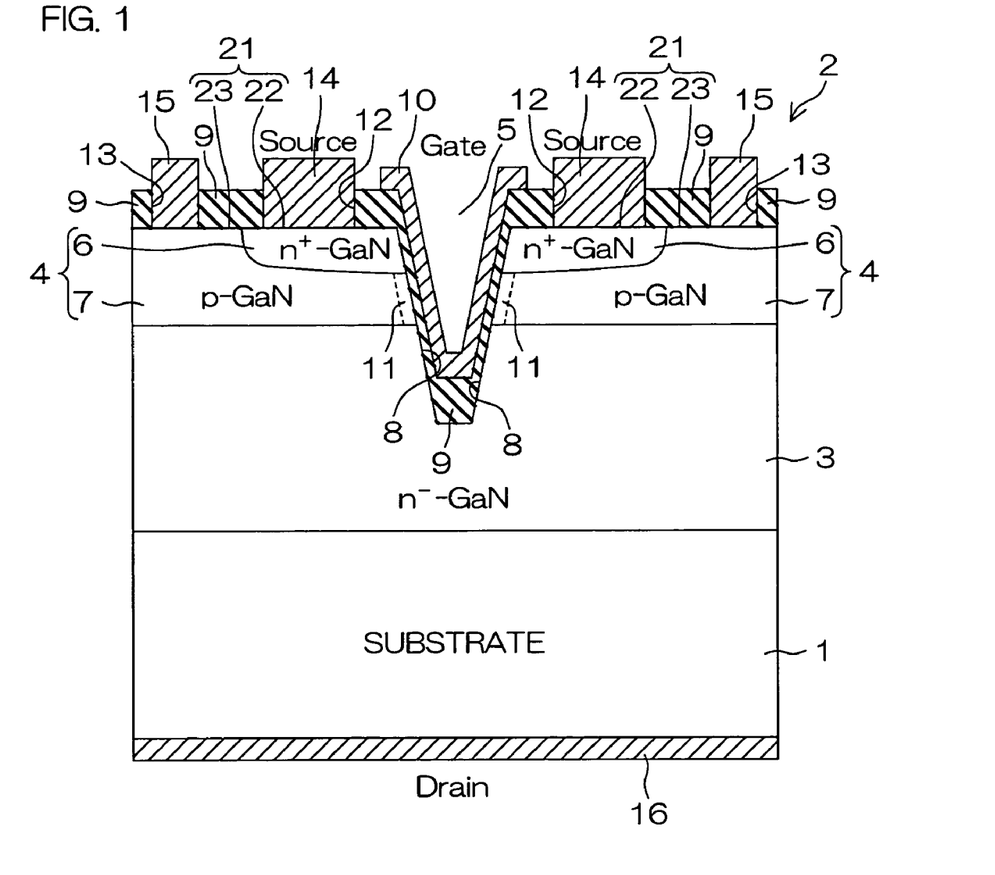
FIG. 1 is a schematic sectional view for illustrating the structure of a nitride semiconductor device according to a first embodiment of the present invention.

FIG. 1 is a schematic sectional view for illustrating the structure of a nitride semiconductor device according to a first embodiment of the present invention.

This nitride semiconductor device includes a substrate 1 and a nitride semiconductor multilayer structure portion 2 formed on one surface of the substrate 1.

For example, an insulating substrate such as a sapphire substrate or a conductive substrate such as a GaN substrate, a ZnO substrate, an Si substrate or an SiC substrate can be applied as the substrate 1. According to this embodiment, a conductive substrate is applied.

The nitride semiconductor multilayer structure portion 2 includes an $n^-$-type layer 3 made of $n^-$-type GaN (gallium nitride) laminated on the substrate 1 and a p-type layer 4 made of GaN containing a p-type impurity laminated on the $n^-$-type layer 3.

The nitride semiconductor multilayer structure portion 2 is provided with a trench 5 having a depth reaching an intermediate portion of the $n^-$-type layer 3 in the laminating direction of the nitride semiconductor multilayer structure portion 2 (this direction may hereinafter be simply referred to as "laminating direction") from an outermost surface 21 of the p-type layer 4 parallel to the laminating interface of the nitride semiconductor multilayer structure portion 2 (this interface may hereinafter be simply referred to as "laminating interface").

The trench 5 has a generally V-shaped section, and is in the form of stripes extending in a direction orthogonal to the laminating direction. While FIG. 1 shows only one trench 5, a plurality of such trenches 5 are formed at regular intervals in a width direction orthogonal to the direction of the stripes (this direction may hereinafter be simply referred to as "width direction").

In the p-type layer 4, peripheral regions of the trench 5 spreading in the width direction from the upper portions of inclined surfaces (wall surfaces 8 described later) of the trench 5 are $n^+$-type regions 6 containing an n-type impurity in a higher concentration than a p-type impurity. On the other hand, the remaining region of the p-type layer 4 other than $n^+$-type regions 6 is a body region 7 containing the p-type impurity in a higher concentration than the n-type impurity.

The n+-type regions 6, into which the n-type impurity is ion-implanted in a higher concentration than the n−-type layer 3, have an n-type impurity concentration of $1 \times 10^{18}$ to $1 \times 10^{20}$ cm$^{-3}$, for example. On the other hand, the n−-type layer 3 has an n-type impurity concentration of $1 \times 10^{16}$ to $1 \times 10^{17}$ cm$^{-3}$, for example.

The inclined side surfaces of the trench 5 form the wall surfaces 8 extending over the n−-type layer 3, the body region 7 and the n+-type regions 6.

Channel layers 11 are formed in semiconductor surface portions of the body region 7 on the wall surfaces 8. The channel layers 11 are made of a semiconductor having conductivity different from that of the body region 7, such as a p−-type semiconductor having an acceptor concentration lower than that of the body region 7, for example. The thickness of the channel layers 11 in directions orthogonal to the wall surfaces 8 is several nm to 100 nm, for example. The material for the channel layers 11 is not restricted to the p−-type semiconductor, but may be an n-type semiconductor containing an n-type impurity, an i-type semiconductor hardly containing an impurity or a semiconductor containing n-type and p-type impurities, for example, so far as the semiconductor has conductivity different from that of the body region 7. Inversion layers conducting the n−-type layer 3 and the n+-type regions 6 are formed in the vicinity of the surfaces of the channel layers 11, when a proper bias voltage is supplied to a gate electrode 10 (described later).

The n−-type layer 3 and the p-type layer 4 are epitaxially grown on the substrate 1 by MOCVD (Metal Organic Chemical Vapor Deposition), for example.

When the major surface of the substrate 1 is defined by a c-plane (0001), for example, the n-type layer 3 and the p-type layer 4 epitaxially grown on the substrate 1 are also laminated with major surfaces (laminating interface) defined by c-planes (0001). The wall surfaces 8 of the nitride semiconductor multilayer structure portion 2 are orientated along planes (other than c-planes) inclined in the range of 15° to 90° with respect to the c-planes (0001), for example. More specifically, the wall surfaces 8 are defined by nonpolar planes such as m-planes (10-10) or a-planes (11-20) or semipolar planes such as (10-13), (10-11) or (11-22), for example.

A gate insulating film 9 is formed on the region of the outermost surface 21 of the p-type layer 4, to cover the overall regions of the wall surfaces 8.

The gate insulating film 9 can be made of a nitride or an oxide, for example. More specifically, the gate insulating film 9 can be made of silicon oxide (SiO$_2$), gallium oxide (Ga$_2$O$_3$), magnesium oxide (Mg), scandium oxide (Sc$_2$O$_3$) or silicon nitride (SiN). According to this embodiment, the gate insulating film 9 has a two-layer structure (SiN/SiO$_2$) of a portion mainly containing SiN in contact with the nitride semiconductor multilayer structure portion 2 and a portion mainly containing SiO$_2$ formed on the upper side of the portion mainly containing SiN. The gate electrode 10 is formed on the gate insulating film 9.

The gate electrode 10 is opposed to the wall surfaces 8, i.e., the n−-type layer 3, the channel regions 11 and the n+-type regions 6 through the gate insulating film 9, and extends up to regions close to edge portions of the trench 5 on the outermost surface 21 of the p-type layer 4. The gate electrode 10 can be made of a conductive material such as an Ni/Au alloy consisting of Ni and Au laminated on this Ni, a Pd/Au alloy, a Pd/Ti/Au alloy, a Pd/Pt/Au alloy, Pt, Al or polysilicon, for example.

The gate insulating film 9 is provided with openings 12 and 13 exposing the outermost surface 21 of the p-type layer 4. More specifically, the openings 12 expose outermost surfaces 22 of the n+-type regions 6 parallel to the laminating interface. On the other hand, the openings 13 expose an outermost surface 23 of the body region 7 parallel to the laminating interface.

Source electrodes 14 are formed on the portions of the n+-type regions 6 exposed from the openings 12 through the openings 12. The source electrodes 14 can be made of a metal such as a Ti/Al alloy consisting of Ti and Al laminated on this Ti, for example, and are electrically connected to the n+-type regions 6. The source electrodes 14 are so made of the metal containing Al that an excellent ohmic property can be attained between the source electrodes 14 and the n+-type regions 6. Alternatively, the source electrodes 14 may be made of Mo or an Mo compound (molybdenum silicide, for example), Ti or a Ti compound (titanium silicide, for example), or W or a W compound (tungsten silicide, for example).

On the other hand, body electrodes 15 are formed on the portions of the body region 7 exposed from the openings 13 through the openings 13. The body electrodes 15 can be made of a metal such as an Ni/Au alloy consisting of Ni and Au laminated on this Ni, a Pd/Au alloy, a Pd/Ti/Au alloy, a Pd/Pt/Au alloy or Pt, for example, and are electrically connected to the body region 7. The aforementioned metal has low contact resistance with respect to a group III nitride semiconductor mainly containing a p-type impurity. Therefore, the body electrodes 15 are so made of the aforementioned metal that an excellent ohmic property can be attained between the body electrodes 15 and the body region 7. The body electrodes 15 are electrically connected with the source electrodes 14 through wires (not shown).

A drain electrode 16 is formed in contact with the other surface of the substrate 1. The drain electrode 16 can be made of a metal such as Al, for example, and is electrically connected to the n−-type layer 3 through the substrate 1. Alternatively, the drain electrode 16 may be made of Mo or an Mo compound (molybdenum silicide, for example), Ti or a Ti compound (titanium silicide, for example), or W or a W compound (tungsten silicide, for example).

The operation of the aforementioned nitride semiconductor device is now described.

A bias positive on the side of the drain electrode 16 is supplied between the source electrodes 14 and the drain electrode 16. Thus, a reverse voltage is supplied to a p-n junction on the interface between the n−-type layer 3 and the body region 7. Consequently, the n+-type regions 6 and the n−-type layer 3, i.e., the source electrodes 14 and the drain electrode 16 (the source and the drain) are cut off (reverse-biased).

When a bias exceeding a gate threshold voltage positive with reference to the potentials of the source electrodes 14 is applied to the gate electrode 10 in this state, electrons are induced in the vicinity of the interfaces between the channel layers 11 and the gate insulating film 9, to form inversion layers (channels).

The n−-type layer 3 and the n+-type regions 6 conduct through these inversion layers. Thus, the source and the drain conduct. In other words, the source and the drain conduct when a prescribed bias is applied to the gate electrode 10, while the source and the drain are cut off when no bias is supplied to the gate electrode 10. Thus, a transistor operation is implemented.

FIGS. 2A to 2E are schematic sectional views for illustrating a method for producing the nitride semiconductor device shown in FIG. 1.

Figure 2A:
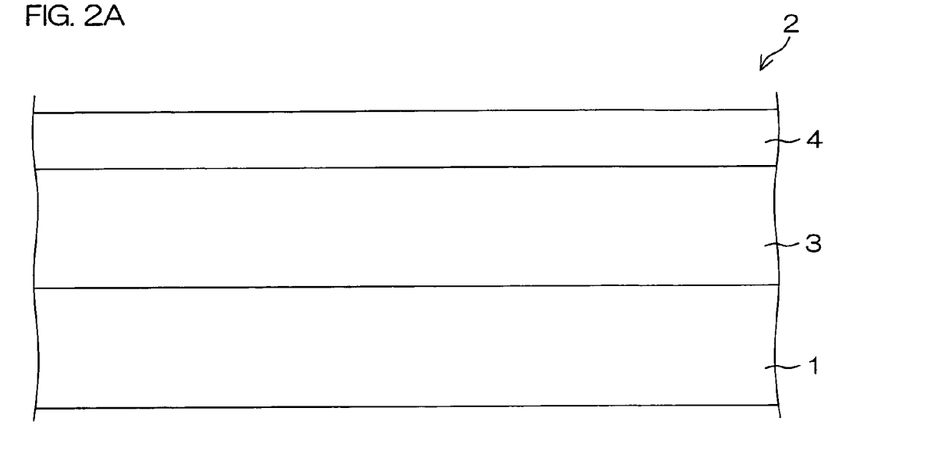
FIGS. 2A to 2E are schematic sectional views for illustrating a method for producing the nitride semiconductor device shown in FIG. 1.

In order to produce the nitride semiconductor device, GaN doped with an n-type impurity is first grown from one surface of the substrate 1 by MOCVD (Metal Organic Chemical Vapor Deposition), for example. GaN is grown in a direction orthogonal to one surface of the substrate 1, thereby forming the n⁻-type layer 3. Si, for example, may be employed as the n-type impurity for doping the grown GaN.

Then, GaN doped with a p-type impurity is grown on the n⁻-type layer 3 by MOCVD, for example, to form the p-type layer 4. Mg or C, for example, may be employed as the p-type impurity for doping GaN. Thus, the nitride semiconductor multilayer structure portion 2 consisting of the n⁻-type layer 3 and the p-type layer 4 having the laminating interface parallel to the major growth surface (one surface) of the substrate 1 is formed on the first surface of the substrate 1, as shown in FIG. 2A.

Figure 2B:
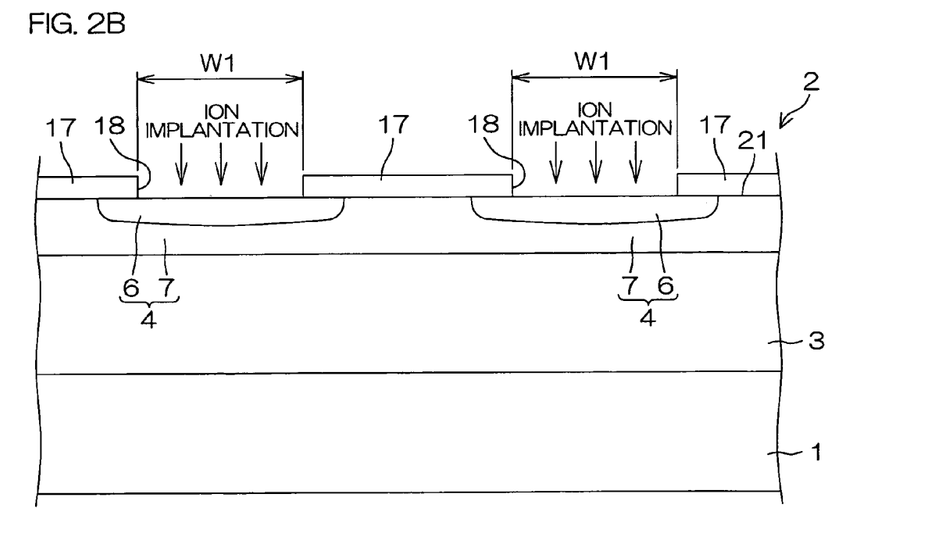

Then, a first mask 17 provided with a plurality of openings 18, each having a width W1 (3 to 10 μm, for example), orthogonal to a stripe portion of the trenches 5 described later is formed on the outermost surface 21 of the p-type layer 4 parallel to the laminating interface.

After the formation of the first mask 17, ions of an n-type impurity (Si, for example) are radiated to portions of the p-type layer 4 exposed from the openings 18 of the first mask 17, so that the n-type impurity is implanted into portions around the outermost surface 21 of the p-type layer 4. The acceleration energy for implanting the n-type impurity is 60 keV, for example, and the dose of the n-type impurity implanted with this acceleration energy is $8 \times 10^{14}$ cm$^{-2}$, for example.

Thereafter tempering (annealing) is performed at 1000° C. for 10 minutes, for example. The n-type impurity implanted into the p-type layer 4 coordinates with each site of the GaN crystal structure due to this tempering.

Thus, the n⁺-type regions 6 are formed in peripheral regions of the openings 18 spreading in the width direction from the portions exposed from the openings 18 while the body region 7 mainly containing the p-type impurity is formed on the remaining portion, as shown in FIG. 2B.

Figure 2C:
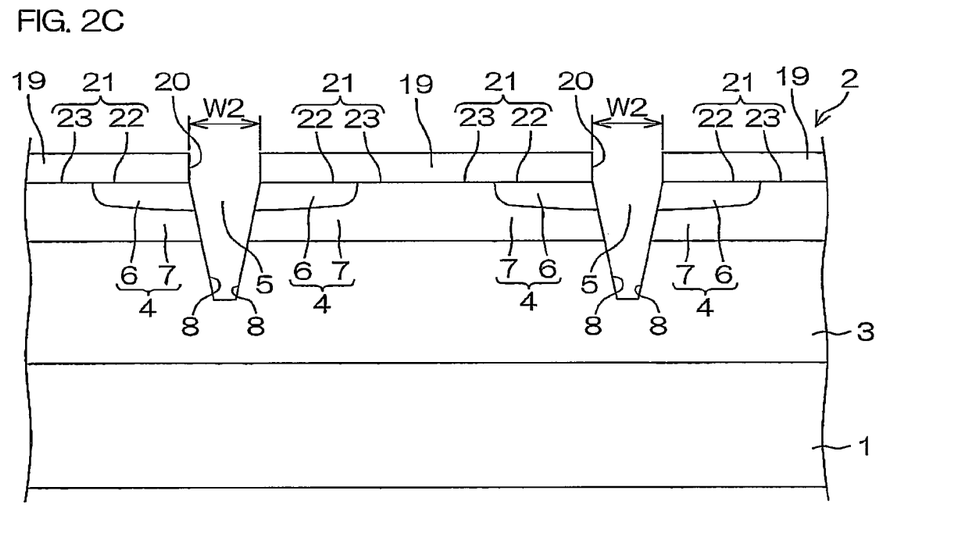

Then, the first mask 17 is removed, and a second mask 19, provided with openings 20 each having a width W2 (0.5 to 5 μm, for example) smaller than the width W1 of the openings 18 is thereafter formed on the outermost surface 21 of the p-type layer 4. The second mask 19 is so formed that the width-directional centers of the openings 20 are generally located on the width-directional centers of the n⁺-type regions 6, for example. In other words, parts of the outermost surfaces 22 of the n⁺-type regions 6 parallel to the laminating interface and the outermost surface 23 of the body region 7 parallel to the laminating interface are covered with the second mask 19 in the state provided with the mask 19.

The nitride semiconductor multilayer structure portion 2 is etched in a striped manner through the second mask 19. In other words, the striped trenches 5 having the depth reaching the intermediate portion of the n⁻-type layer 3 in the laminating direction are formed from the outermost surfaces 22 of the n⁺-type regions 6 through the n⁺-type regions 6 and the body region 7. Thus, a plurality of nitride semiconductor multilayer structure portions 2 are shaped in a striped manner, while the wall surfaces 8 extending over the n⁻-type layer 3, the body region 7 and the n⁺-type regions 6 are formed at the same time, as shown in FIG. 2C.

The trenches 5 can be formed by dry etching (anisotropic etching) employing chlorine-based gas, for example. After the dry etching, a wet etching treatment may be performed for improving the wall surfaces 8 of the trenches 5 damaged by the dry etching, if necessary.

KOH (potassium hydroxide) or NaOH (sodium hydroxide) is preferably employed for the wet etching. Thus, the damaged wall surfaces 8 can be improved, so that the wall surfaces 8 are less damaged. An Si-based oxide, an oxide of Ga and the like can be removed also by wet etching with HF (hydrofluoric acid) or HCl (hydrochloric acid), and hence the wall surfaces 8 can be so leveled that the wall surfaces 8 are less damaged. Damage of the wall surfaces 8 is so reduced that the channel layers 11 (see FIG. 1) can be kept in excellent crystal states. Further, the interfaces between the wall surfaces 8 and the gate insulating film 9 can be rendered excellent. Consequently, the interfacial level can be reduced. Thus, channel resistance can be reduced, and a leakage current can be suppressed. Low-damage dry etching can also be applied in place of the wet etching treatment.

After the formation of the trenches 5, the second mask 19 is removed, whereby the n⁺-type regions 6 and the body region 7 having been covered with the second mask 19 are exposed.

Then, the substrate 1 provided with the nitride semiconductor multilayer structure portions 2 is introduced into an ECR (Electron Cyclotron Resonance) sputtering apparatus. Ar⁺ plasma having energy of about 30 eV, for example, is generated in the ECR sputtering apparatus along with introduction of nitrogen gas (N₂ gas), to form a nitrogen atmosphere in the apparatus. The nitrogen atmosphere denotes an environment in high-temperature nitrogen gas or nitrogen plasma irradiated with nitrogen molecules, nitrogen atoms, nitrogen radicals and a compound of nitrogen, for example. The nitrogen atmosphere is so formed in the apparatus as to nitride portions around the surfaces of the nitride semiconductor multilayer structure portions 2. Then, Ar⁺ plasma is applied to the surfaces of the nitride semiconductor multilayer structure portions 2 for several seconds. Due to this irradiation with the Ar⁺ plasma, the properties of semiconductor surface portions of the body region 7 exposed through the formation of the wall surfaces 8 are changed to form the channel layers 11 having conductivity different from that of the body region 7, as shown in FIG. 2D.

The channel layers 11 can alternatively be formed by ion-implanting Si into the body region 7 thereby changing the properties of the semiconductor surface portions of the body region 7. Further alternatively, the channel layers 11 can be formed by regrowing the group III nitride semiconductor from the exposed wall surfaces 8, in place of the method of changing the properties of the semiconductor surface portions of the body region 7. In this case, the channel layers 11 can also be formed by MOCVD. The conductivity can be controlled by controlling addition of an impurity.

Figure 2D:
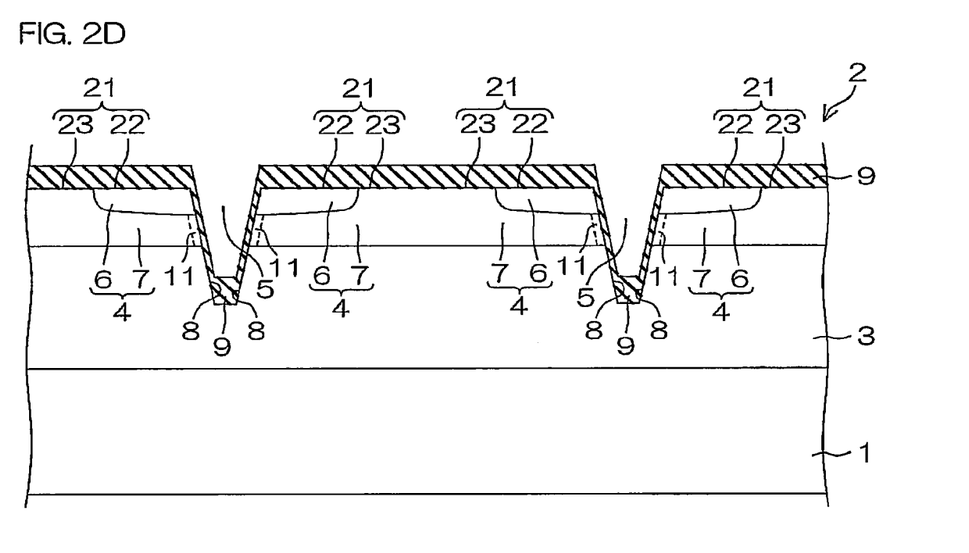

Thereafter an insulating film covering the overall surfaces of the nitride semiconductor multilayer structure portions 2 is formed, whereby the gate insulating film 9 is formed as shown in FIG. 2D.

Then, the gate insulating film 9 is dry-etched in a striped manner through a photoresist film (not shown) having openings in regions for forming the openings 12 and 13 by well-known photolithography.

Thus, the openings 12 and 13 are formed to partially expose the n⁺-type regions 6 and the body region 7.

Figure 2E:
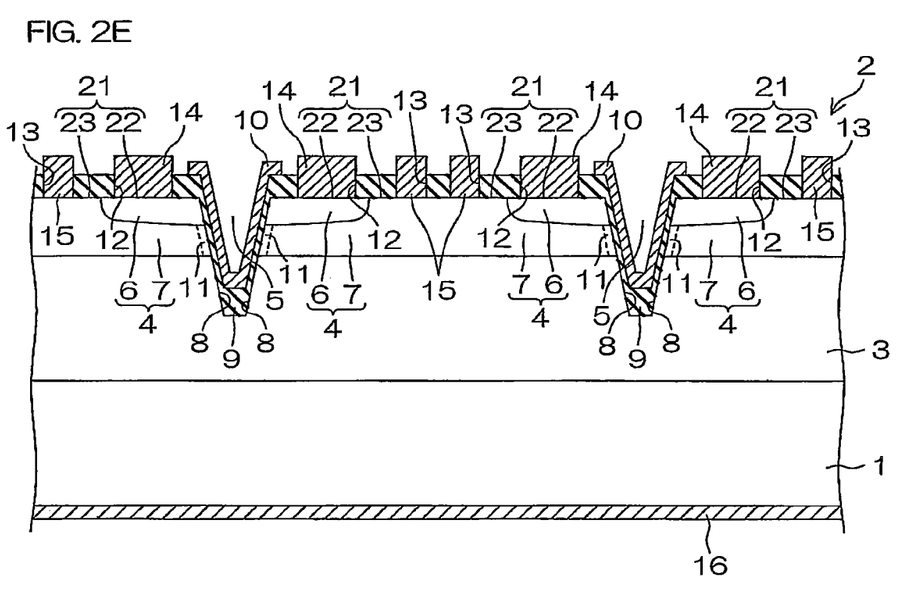

Then, metals (Ti and Al in this embodiment) employed as the materials for the source electrodes 14 are sputtered through a photoresist film (not shown) having openings in regions for forming the source electrodes 14 by well-known photolithography. Thereafter the photoresist film is removed, whereby unnecessary portions (other than the source electrodes 14) of the metals are lifted off along with the photoresist film. The source electrodes 14 are formed on the outermost surfaces 22 of the n⁺-type regions 6 through these steps.

After the formation of the source electrodes 14, thermal alloying (annealing) is performed at 650° C. for one minute, for example.

Then, metals (Ni and Au in this embodiment) employed as the materials for the body electrodes 15 are sputtered through a photoresist film (not shown) having openings in regions for forming the body electrodes 15 by well-known photolithography. Thereafter the photoresist film is removed, whereby unnecessary portions (other than the body electrodes 15) of the metals are lifted off along with the photoresist film. The body electrodes 15 are formed on the outermost surface 23 of the body region 7 through these steps. In other words, the body electrodes 15 are formed on the outermost surface 23 of the body region 7 having been covered with the second mask 19 in the formation of the trenches 5.

Thereafter gate electrodes 10 opposed to the wall surfaces 8 through the gate insulating film 9 are formed by a method similar to those for the source electrodes 14 and the body electrodes 15.

Then, the drain electrode 16 is formed on the other surface of the substrate 1 by a method similar to those for the source electrodes 14 and the body electrodes 15.

Thus, the nitride semiconductor device shown in FIG. 1 can be obtained, as shown in FIG. 2E.

The plurality of nitride semiconductor multilayer structure portions 2 form unit cells respectively. The gate electrodes 10 and the source electrodes 14 of the nitride semiconductor multilayer structure portions 2 are connected in common on unshown positions respectively. The drain electrode 16, formed in contact with the substrate 1, is common to all cells.

In the nitride semiconductor device according to this embodiment, as hereinabove described, the $n^-$-type layer 3 made of $n^-$-type GaN (gallium nitride) and the body region 7, mainly containing the p-type impurity, of the p-type layer 4 made of GaN containing the p-type impurity form the p-n junction. The drain electrode 16 is formed in contact with the other surface of the substrate 1, whereby the $n^-$-type layer 3 is electrically connected with the drain electrode 16. On the other hand, the body electrodes 15 are formed on the body region 7 through the openings 13 of the gate insulating film 9. In this nitride semiconductor device, therefore, a p-n diode is formed by the body electrodes 15, the body region 7, the $n^-$-type layer 3 and the drain electrode 16. The body electrodes 15 of this p-n diode are, electrically connected with the source electrodes 14 on unshown positions.

Also when a bias positive on the side of the source electrodes 14 is applied to the drain electrode 16 and the potentials of the source electrodes 14 exceed that of the drain electrode 16 in operation of the nitride semiconductor device, therefore, a high current generated by this bias can be preferentially fed to the aforementioned p-n diode.

Consequently, field concentration on the boundaries (p-n junctions) between the body region 7 and the $n^+$-type regions 6 can be suppressed, whereby the nitride semiconductor device can be prevented from breakage.

Further, the body electrodes 15 for preventing the device from breakage are formed in contact with the outermost surface 23 of the body region 7 having been covered with the second mask 19 in the formation of the trench 5 of the nitride semiconductor device. Therefore, an excellent ohmic property can be obtained on the junction between the body region 7 and the body electrodes 15.

When a group III nitride semiconductor containing a p-type impurity is etched, an n-type impurity concentration in the etched portion is generally increased due to nitrogen escape from the semiconductor surface, for example. For example, the n-type impurity concentrations of portions exposed through dry etching such as those of the body region 7 on the wall surfaces 8 of the nitride semiconductor multilayer structure portion 2 exceed that in the remaining portion of the body region 7. When the body electrodes 15 are formed in contact with the portions having large n-type impurity concentrations, it is difficult to attain an excellent ohmic property between the body region 7 and the body electrodes 15.

According to this embodiment, on the other hand, the body electrodes 15 are formed in contact with the outermost surface 23 of the body region 7 having been covered with the second mask 19. Therefore, an excellent ohmic property can be attained on the junctions between the body region 7 and the body electrodes 15. Consequently, resistance can be reduced when a current flows to the p-n diode formed by the body electrodes 15, the body region 7, the $n^-$-type layer 3 and the drain electrode 16.

According to this embodiment, the channel layers 11 are formed in the semiconductor surface portions of the body region 7 on the wall surfaces 8, and the gate electrode 10 is opposed to the channel layers 11 through the gate insulating film 9. In operation of the nitride semiconductor device, therefore, the inversion layers (channels) are formed in the vicinity of the interfaces between the channel layers 11 and the gate insulating film 9. Further, the channel layers 11 are made of a semiconductor such as a $p^-$-type semiconductor, an n-type semiconductor, an i-type semiconductor or a semiconductor containing n-type and p-type impurities, for example. Therefore, the value of a gate voltage necessary for forming the inversion layers (channels) can be reduced. Consequently, the value of the gate threshold voltage can be reduced and electron mobility can be improved while keeping the acceptor concentration of the body region 7 at a high level, so that no reach-through breakdown takes place. Thus, on-resistance can be reduced, and an excellent power device can be implemented.

In the steps of producing the nitride semiconductor device, the $n^+$-type regions 6 are formed by forming the p-type layer 4 containing the p-type impurity by epitaxy and thereafter ion-implanting the n-type impurity into the p-type layer 4.

An n-type impurity can be more easily ion-implanted into a group III nitride semiconductor than a p-type impurity. Therefore, the p-type layer 4 having the body region 7 and the $n^+$-type regions 6 can be easily formed through the aforementioned steps, and a transistor structure can be easily produced.

In a field-effect transistor having an n-p-n structure, positive holes (holes) may remain in a portion located immediately under a channel (a portion of a p-type semiconductor layer close to the channel) due to such impact ionization that electrons flowing in the channel collide with atoms constituting the p-type semiconductor layer during the operation of the field-effect transistor. In this case, an over current may flow in the channel to cause avalanche breakdown due to electron attraction by the residual positive holes.

In the nitride semiconductor device according to this embodiment, however, the body region 7 provided with the channel layers 11 is electrically connected with the body electrodes 15 electrically connected with the source electrodes 14.

When electrons flowing in the channel layers 11 collide with atoms constituting the p-type layer 4 (the body region 7) in operation of the device and positive holes resulting from impact ionization move outward in the width direction of the channel layers 11 (in directions separating from the gate electrode 10) due to Coulomb force with respect to the gate electrode 10 having a higher potential than the source electrodes 14 and are forced to portions (immediately under the channels) located immediately under the channel layers 11 of the body region 7, therefore, the potentials of the body electrodes 15 are set to the same reference potentials as the source electrodes 14, and hence the positive holes can be fed to the body electrodes 15. Therefore, electron attraction resulting from residual positive holes can be suppressed, and avalanche breakdown can be suppressed.

Figure 3:
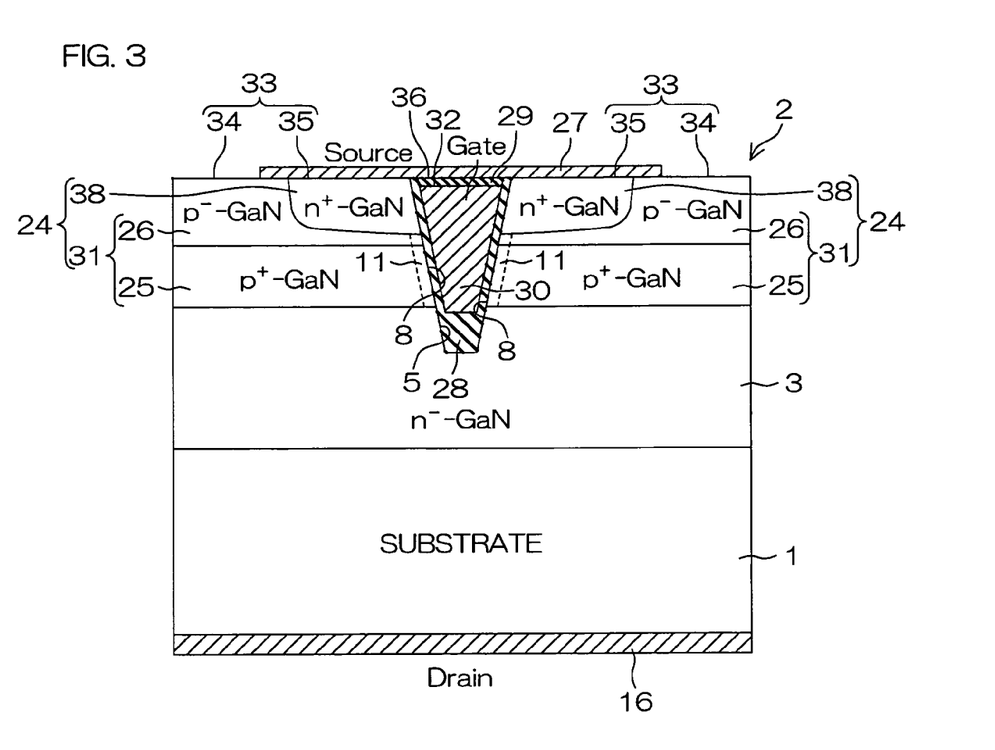
FIG. 3 is a schematic sectional view for illustrating the structure of a nitride semiconductor device according to a second embodiment of the present invention.

FIG. 3 is a schematic sectional view for illustrating the structure of a nitride semiconductor device according to a second embodiment of the present invention. Referring to FIG. 3, portions corresponding to those shown in FIG. 1 are denoted by the same reference numerals. Further, redundant description is omitted as to the portions denoted by the same reference numerals.

Referring to FIG. 3, a nitride semiconductor multilayer structure portion 2 includes an n$^-$-type layer 3 and a p-type layer 24 made of GaN containing a p-type impurity provided on the n$^-$-type layer 3.

The p-type layer 24 includes a p$^+$-type layer 25 laminated on the n$^-$-type layer 3 and a p$^-$-type layer 26 laminated on the p$^+$-type layer 25.

The p$^+$-type layer 25 has a relatively high p-type impurity concentration of $1\times10^{18}$ to $4\times10^{19}$ cm$^{-3}$, for example, with respect to the p$^-$-type layer 26.

On the other hand, the p$^-$-type layer 26 has a relatively low p-type impurity concentration of $1\times10^{18}$ to $1\times10^{19}$ cm$^{-3}$, for example, with respect to the p$^+$-type layer 25.

Referring to FIG. 3, a trench 5 is formed in a depth reaching an intermediate portion of the n$^-$-type layer 3 in the laminating direction of the nitride semiconductor multilayer structure portion 2 (this direction may hereinafter be simply referred to as "laminating direction") from an outermost surface 33 of the p-type layer 24 parallel to the laminating interface of the nitride semiconductor multilayer structure portion 2 (this interface may hereinafter be simply referred to as "laminating interface").

In the p-type layer 24, peripheral regions of the trench 5 spreading in the width direction from lower portions of wall surfaces 8 of the trench 5 in the p$^-$-type layer 26 are n$^+$-type regions 38 containing an n-type impurity in a higher concentration than a p-type impurity. On the other hand, the remaining region of the p-type layer 24 other than the n$^+$-type regions 38, i.e., the region of the p-type layer 26 other than the n$^+$-type regions 38 and the overall region of the p$^+$-type layer 25, is a body region 31 containing the p-type impurity in a higher concentration than the n-type impurity.

Channel layers 11 are formed in semiconductor surface portions of the body region 31 on the wall surfaces 8, to extend over the p$^+$-type layer 25 and the p$^-$-type layer 26. A gate insulating film 28 is formed on the wall surfaces 8, to cover the overall regions thereof.

The gate insulating film 28 can be made of an insulating material similar to that for the gate insulating film 9, for example. A gate electrode 30 is formed on the gate insulating film 28 to be opposed to the wall surfaces 8, i.e., the n$^-$-type layer 3, the channel layers 11 and the n$^+$-type regions 38 through the gate insulating film 28.

The gate electrode 30 is so formed in the trench 5 that an outer surface 32 thereof parallel to the laminating interface is located below (closer to a substrate 1) the outermost surface 33 of the p-type layer 24. Thus, a gap corresponding to the difference between the vertical positions of the outermost surfaces 32 and 33 is formed in the trench 5 on a region above the gate electrode 30. The gate electrode 30 can be made of a conductive material similar to that for the gate electrode 10, for example.

An insulating film 29 is formed on the outermost surface 32 of the gate electrode 30, to fill up the aforementioned gap.

The insulating film 29 is so formed that an outermost surface 36 thereof parallel to the laminating interface is flush with the outermost surface 33 of the p-type layer 24 in a direction parallel to the laminating interface. The insulating film 29 can be made of an insulating material similar to that for the gate insulating film 28, for example.

A source electrode 27 is formed on the insulating film 29 and the p-type layer 24 flush with each other in the direction parallel to the laminating interface.

The source electrode 27 is formed to extend over outermost surfaces 35 and 34 of the n$^+$-type regions 38 and the p$^-$-type layer 26 on the outermost surface 33 of the p-type layer 24, and integrally provided with portions formed in contact with the n$^+$-type regions 38 and portions formed in contact with the p$^-$-type layer 26. Thus, the portions of the source electrode 27 in contact with the n$^+$-type regions 38 can substitute for the source electrodes 14 shown in FIG. 1, while the portions of the source electrode 27 in contact with the p$^-$-type layer 26 can substitute for the body electrodes 15 shown in FIG. 1. In other words, the source electrode 27 can substitute for the two types of electrodes (the source electrodes 14 and the body electrodes 15) shown in FIG. 1. In this embodiment, the source electrode 27 denotes an electrode serving both as the source electrodes 14 and the body electrodes 15 in the first embodiment.

The source electrode 27 can be made of a metallic material similar to that for the source electrodes 14 shown in FIG. 1, for example. The source electrode 27 is made of the metallic material similar to that for the source electrodes 14, whereby an excellent ohmic property can be attained on the junctions between the source electrode 27 and the n$^+$-type regions 38, while the source electrode 27 can be brought into Schottky contact with the p$^-$-type layer 26. The insulating film 29 insulates the source electrode 27 from the gate electrode 30.

The remaining structure of the second embodiment is similar to that of the aforementioned first embodiment.

The operation of the aforementioned nitride semiconductor device is now described.

A bias positive on the side of the drain electrode 16 is supplied between the source electrode 27 and the drain electrode 16. Thus, a reverse voltage is supplied to a p-n junction between the n$^-$-type layer 3 and the body region 31. Consequently, the n$^+$-type regions 38 and the n-type layer 3, i.e., the source electrode 27 and the drain electrode 16 (the source and the drain) are cut off (reverse-biased).

When a bias exceeding a gate threshold voltage positive with reference to the potential of the source electrode 27 is applied to the gate electrode 30 in this state, electrons are induced in the vicinity of the interfaces between the channel layers 11 and the gate insulating film 28, to form inversion layers (channels).

The n$^-$-type layer 3 and the n$^+$-type regions 38 conduct through the inversion layers. Thus, the source and the drain conduct. In other words, the source and the drain conduct when a prescribed bias is supplied to the gate electrode 30, while the source and the drain are cut off when no bias is supplied to the gate electrode 30. Thus, a transistor operation is implemented.

FIGS. 4A to 4F are schematic sectional views for illustrating a method for producing the nitride semiconductor device shown in FIG. 3.

Figure 4A:
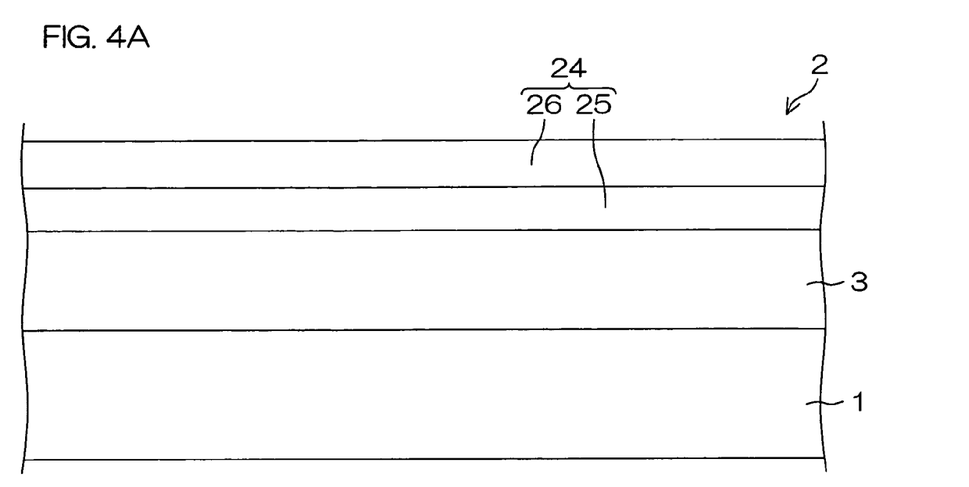
FIGS. 4A to 4F are schematic sectional views for illustrating a method for producing the nitride semiconductor device shown in FIG. 3.

In order to produce the nitride semiconductor device, the n$^-$-type layer 3 is formed on one surface of the substrate 1.

Then, GaN doped with a p-type impurity is grown on the n$^-$-type layer 3 by MOCVD, for example, to form the p$^+$-type layer 25. After the formation of the p$^+$-type layer 25, the concentration of the p-type impurity for doping GaN is reduced, to form the p$^-$-type layer 26 having the p-type impurity concentration relatively lower than that of the p$^+$-type layer 25. Thus, the p-type layer 24 consisting of the p$^+$-type layer 25 and the p$^-$-type layer 26 is formed on the n$^-$-type layer 3. Mg or C, for example, may be employed as the p-type impurity employed for doping the grown GaN. Thus, the nitride semiconductor multilayer structure portion 2 consisting of the n$^-$-type layer 3 and the p-type layer 24 and having the laminating interface parallel to the major growth surface (one surface) of the substrate 1 is formed on the first surface of the substrate 1, as shown in FIG. 4A.

Figure 4B:
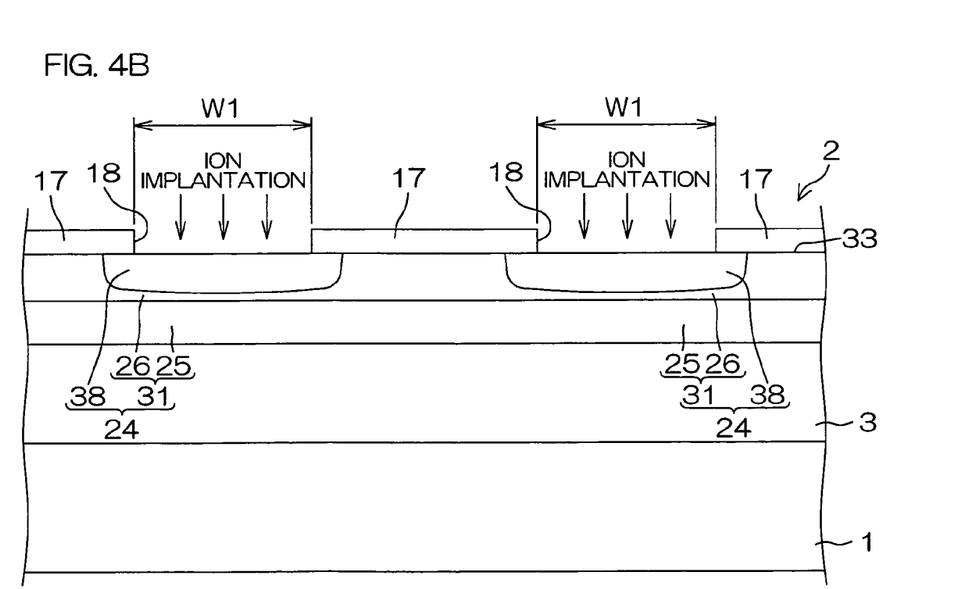

Then, a first mask 17 provided with a plurality of openings 18, each having a width W1 (3 to 10 μm, for example), orthogonal to a stripe portion of trenches 5 described later is formed on the outermost surface 33 of the p-type layer 24 parallel to the laminating interface.

After the formation of the first mask 17, ions of an n-type impurity (Si, for example) are radiated to portions of the p$^-$-type layer 26 exposed from the openings 18 of the first mask 17, so that the n-type impurity is implanted into the p$^-$-type layer 26. The acceleration energy for implanting the n-type impurity is 60 keV, for example, and the dose of the n-type impurity implanted with this acceleration energy is $8 \times 10^{14}$ cm$^{-2}$, for example.

Thereafter tempering (annealing) is performed at 1000° C. for 10 minutes, for example. The n-type impurity implanted into the p$^-$-type layer 26 coordinates with each site of the GaN crystal structure due to this tempering.

Thus, the n$^+$-type regions 38 are formed in peripheral regions of the openings 18 spreading in the width direction from the portions of the p$^-$-type layer 26 exposed from the openings 18 while the body region 31 mainly containing the p-type impurity is formed on the remaining portion of the p$^-$-type layer 26 other than these regions and the overall region of the p$^+$-type layer 25, as shown in FIG. 4B.

Figure 4C:
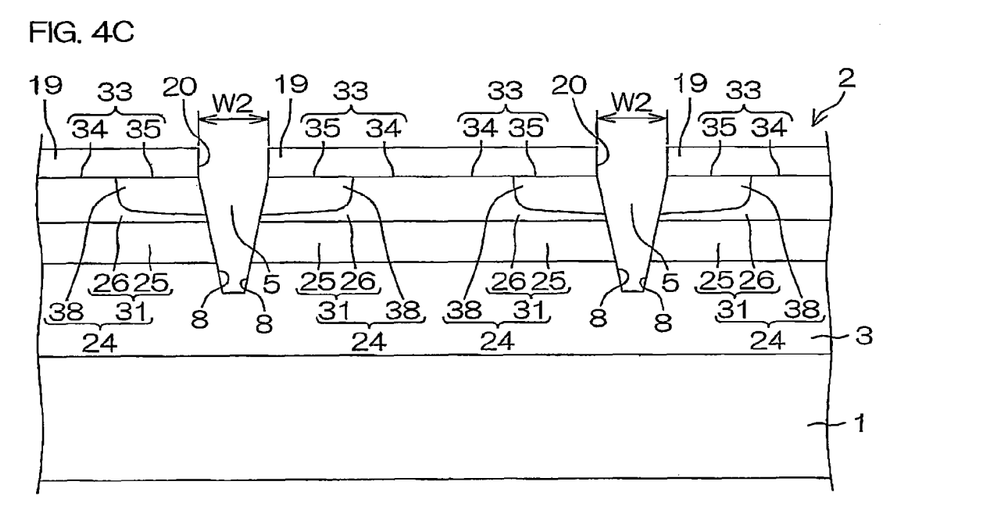

Then, the first mask 17 is removed, and a second mask 19 provided with openings 20 each having a width W2 (0.5 to 5 μm, for example) smaller than the width W1 of the openings 18 is thereafter formed on the outermost surface 33 of the p-type layer 24. The second mask 19 is so formed that the width-directional centers of the openings 20 are generally located on the width-directional centers of the n$^+$-type regions 38, for example. In other words, parts of the outermost surfaces 35 of the n$^+$-type regions 38 parallel to the laminating interface and the outermost surface 34 of the p$^-$-type layer 26 parallel to the laminating interface are covered with the second mask 19 in the state provided with the mask 19.

The nitride semiconductor multilayer structure portion 2 is etched in a striped manner through the second mask 19. In other words, striped trenches 5 having the depth reaching the intermediate portion of the n$^-$-type layer 3 in the laminating direction are formed from the outermost surfaces 35 of the n$^+$-type regions 38 through the n$^+$-type regions 38 and the body region 31. Thus, a plurality of nitride semiconductor multilayer structure portions 2 are shaped in a striped manner, while the wall surfaces 8 extending over the n$^-$-type layer 3, the body region 31 and the n$^+$-type regions 38 are formed at the same time, as shown in FIG. 4C.

After the formation of the trenches 5, the second mask 19 is removed, whereby the n$^+$-type regions 38 and the body region 31 having been covered with the second mask 19 are exposed.

Then, the substrate 1 provided with the nitride semiconductor multilayer structure portions 2 is introduced into an ECR (Electron Cyclotron Resonance) sputtering apparatus. Ar$^+$ plasma having energy of about 30 eV, for example, is generated in the ECR sputtering apparatus along with introduction of nitrogen gas (N$_2$ gas), to form a nitrogen atmosphere in the apparatus. Then, Ar$^+$ plasma is applied to the surfaces of the nitride semiconductor multilayer structure portions 2 for several seconds. Due to this irradiation with the Ar$^+$ plasma, the properties of semiconductor surface portions of the body region 31 (the p$^+$-type layer 25 and the p$^-$-type layer 26) exposed through the formation of the wall surfaces 8 are changed to form the channel layers 11 having conductivity different from that of the body region 7, as shown in FIG. 4D.

Figure 4D:
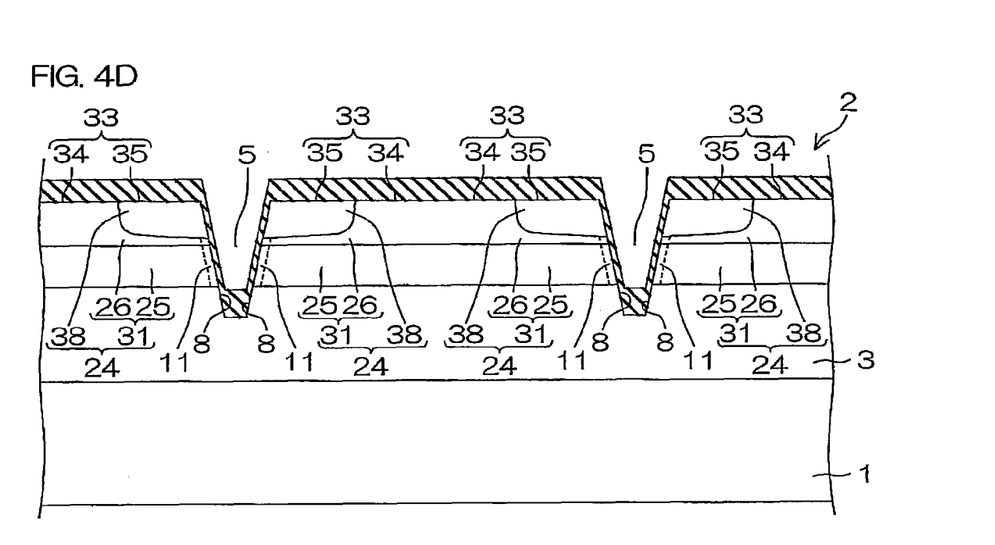

Thereafter an insulating film 37 is formed to cover the overall surfaces of the nitride semiconductor multilayer structure portions 2, as shown in FIG. 4D.

Figure 4E:
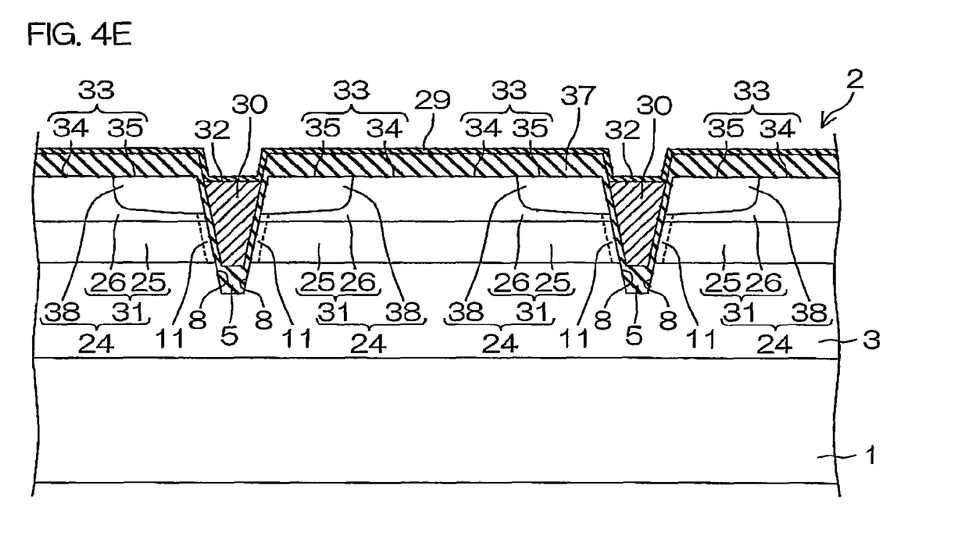

Then, a metal employed as the material for gate electrodes 30 is sputtered through a photoresist film (not shown) having openings in regions for forming the gate electrodes 30 by well-known photolithography. Thereafter the photoresist film is removed, whereby unnecessary portions (other than the gate electrodes 30) of the metal are lifted off along with the photoresist film. The gate electrodes 30 are formed on portions of the insulating film 37 located in the trenches 5 through these steps.

Then, the insulating film 29 is formed on the surface of the insulating film 37 and outermost surfaces 32 of the gate electrodes 30 exposed from the insulating film 37, as shown in FIG. 4E.

Figure 4F:
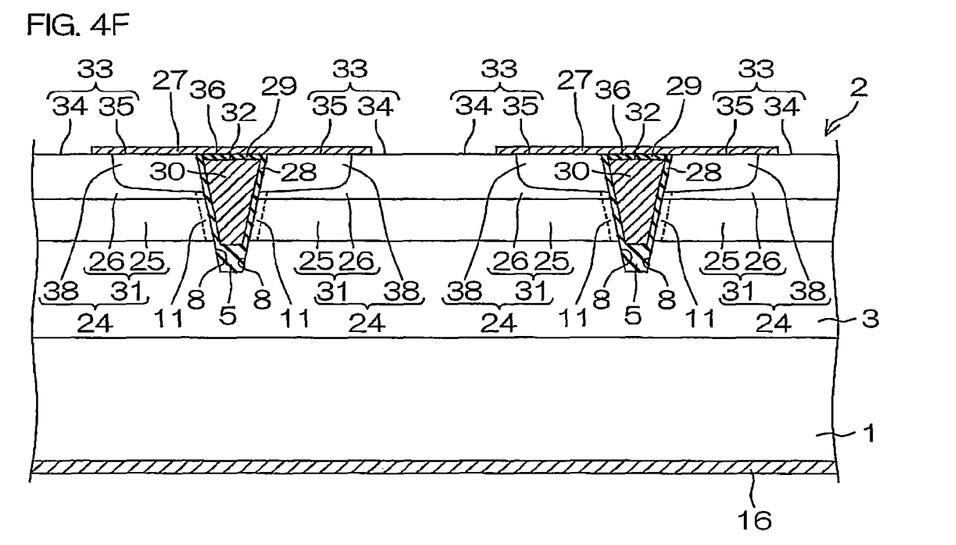

After the formation of the insulating film 29, the insulating films 29 and 37 are dry-etched through a photoresist film (not shown) having openings corresponding to the regions of the nitride semiconductor multilayer structure portions 2 other than the trenches 5 by well-known photolithography. Thus, the outermost surface 33 of the p-type layer 24 (the outermost surfaces 35 of the n$^+$-type regions 38 and the outermost surface 34 of the p-type layer 26) is exposed, and the portions of the insulating film 37 remaining in the trenches 5 form the gate insulating film 28, as shown in FIG. 4F.

Then, metals employed as the materials for source electrodes 27 are sputtered through a photoresist film (not shown) having openings in regions for forming the source electrodes 27 by well-known photolithography. Thereafter the photoresist film is removed, whereby unnecessary portions (other than the source electrodes 27) of the metals are lifted off. The source electrodes 27 extending over the outermost surfaces 35 and 34 of the n$^+$-type regions 38 and the p$^-$-type layer 26 are formed through these steps.

After the formation of the source electrodes 27, thermal alloying (annealing) is performed at 650° C. for one minute, for example.

Thereafter the drain electrode 16 is formed on the other surface of the substrate 1 by a method similar to that for the source electrodes 27.

Thus, the nitride semiconductor device shown in FIG. 3 can be obtained, as shown in FIG. 4F.

The plurality of nitride semiconductor multilayer structure portions 2 form unit cells respectively. The gate electrodes 30 and the source electrodes 27 of the nitride semiconductor multilayer structure portions 2 are connected in common on unshown positions respectively. The drain electrode 16, formed in contact with the substrate 1, is common to all cells.

As hereinabove described, the nitride semiconductor device according to this embodiment can also exhibit functions and effects similar to those of the aforementioned nitride semiconductor device according to the first embodiment. In other words, a p-n diode is formed by the source electrode 27, the body region 31, the n$^-$-type layer 3 and the drain electrode 16 in the nitride semiconductor device. Also when a bias positive on the side of the source electrode 27 is applied to the drain electrode 16 and the potential of the source electrode 27 exceeds that of the drain electrode 16 in operation of the nitride semiconductor device, therefore, a high current generated by this bias can be preferentially fed to the aforementioned p-n diode.

Consequently, field concentration on the boundaries (p-n junctions) between the body region 31 and the n$^+$-type regions 38 can be suppressed, whereby the nitride semiconductor device can be prevented from breakage.

A p-type impurity has a deep impurity level (acceptor level). In order to prepare a p-type group III nitride semiconductor with a p-type impurity, therefore, the group III nitride semiconductor must be doped with the p-type impurity in a high concentration ($1\times10^{19}$ cm$^{-3}$, for example). When an n-type region is formed by doping a part of a group III nitride semiconductor having a high p-type impurity concentration with an n-type impurity, therefore, the resistance of the n-type region may be increased due to impurity scattering of the p-type impurity.

In the nitride semiconductor device according to this embodiment, on the other hand, the n$^+$-type regions 38 are formed in the p$^-$-type layer 26 having the relatively low p-type impurity concentration in the p-type layer 24, whereby the p-type impurity can be inhibited from impurity scattering in the n$^+$-type regions 38. Consequently, increase in the resistance of the n$^+$-type regions 38 can be suppressed, whereby transistor characteristics of the nitride semiconductor device can be improved.

While the two embodiments of the present invention have been described, the present invention may be embodied in other ways.

For example, the n$^-$-type layer 3 and the p-type layer 4 or the p-type layer 24, made of GaN in each of the aforementioned embodiments, can alternatively be made of a group III nitride semiconductor other than GaN, such as aluminum nitride (AlN) or indium nitride (InN), for example, generally expressible as $Al_xIn_yGa_{1-x-y}N$ ($0 \leq x \leq 1$, $0 \leq y \leq 1$ and $0 \leq x+y \leq 1$).

The wall surfaces 8, inclined with respect to the major surface of the substrate 1 in the aforementioned embodiment, may be neither inclined nor planar. In other words, the wall surfaces 8 may be planes perpendicular to the substrate 1, or may be curved surfaces.

The trench 5 formed in the nitride semiconductor multilayer structure portion 2, sectionally V-shaped in the aforementioned embodiment, may alternatively have another shape such as an inversed trapezoidal shape, a U-shape, a rectangular shape or a trapezoidal shape.

The body electrodes 15, electrically connected with the source electrodes 14 on unshown positions in the aforementioned embodiment, may alternatively be connected through a member such as a lead frame, for example, provided outside the substrate 1.

The channel layers 11, formed on the semiconductor surface portions of the body regions 7 or 31 in each of the aforementioned embodiments, may be omitted. In this case, the source and the drain can be conducted by supplying a proper voltage to the gate electrode 10 thereby forming inversion layers (channels) in portions of the body region 7 or 31 close to the wall surfaces 8.

While the source electrode 27 substitutes for the source electrodes 14 and the body electrodes 15 of the first embodiment in the aforementioned second embodiment, source electrodes formed in contact with the n$^+$-type regions 38 and body electrodes formed in contact with the p$^-$-type layer 26 may be provided also in the second embodiment.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2007-334849 filed with the Japanese Patent Office on Dec. 26, 2007 and Japanese Patent Application No. 2008-85639 filed with the Japanese Patent Office on Mar. 28, 2008, the entire disclosures of which are incorporated herein by reference.

What is claimed is:

1. A nitride semiconductor device comprising:
a nitride semiconductor structure portion including
a first layer made of an n-type group III nitride semiconductor,
a second layer made of a group III nitride semiconductor containing a p-type impurity provided on the first layer and an n-type region formed on a part of the second layer such that the nitride semiconductor structure portion has a wall surface extending over the first layer,
a body region of the second layer other than the n-type region and the n-type region;
a gate insulating film formed such that the gate insulating film is opposed to the body region on the wall surface;
a gate electrode formed such that the gate electrode is opposed to the body region through the gate insulating film;
a source electrode formed such that the source electrode is electrically connected to the n-type region;
a drain electrode formed such that the drain electrode is electrically connected to the first layer; and
a body electrode formed such that the body electrode is electrically connected to the body region; wherein
the n-type region and the body region are exposed from an outermost surface of the second layer,
the source electrode is in touch with an exposure portion of the n-type region to the outermost surface,
the body electrode is provided separately from the source electrode such that the body electrode is in touch with an exposure portion of the body region to the outermost surface,
the nitride semiconductor structure portion further includes a third layer, formed on a semiconductor surface portion of the body region on the wall surface, having conductivity different from that of the body region, and extending over the n-type region and the first layer along the wall surface, and
the gate insulating film is interposed between the third layer and the gate electrode.

2. A nitride semiconductor device comprising:
a nitride semiconductor structure portion including a first layer made of an n-type group III nitride semiconductor, a second layer made of a group III nitride semiconductor containing a p-type impurity provided on the first layer and an n-type region formed on a part of the second layer such that the nitride semiconductor structure portion has a wall surface extending over the first layer, a body region of the second layer other than the n-type region and the n-type region;
a gate insulating film formed such that the gate insulating film is opposed to the body region on the wall surface;
a gate electrode formed such that the gate electrode is opposed to the body region through the gate insulating film;
a source electrode formed such that the source electrode is electrically connected to the n-type region;
a drain electrode formed such that the drain electrode is electrically connected to the first layer; and a body electrode formed such that the body electrode is electrically connected to the body region; wherein the second layer includes a high-concentration layer having a relatively high p-type impurity concentration provided on the first layer and a low-concentration layer having a relatively low p-type impurity concentration provided on the high-concentration layer, the n-type region is formed on the low-concentration layer, the low-concentration layer is exposed from the wall surface and is opposed to the gate electrode through the gate insulating film, the nitride semiconductor structure portion further includes a third layer, formed on a semiconductor surface portion of the body region on the wall surface, having conductivity different from that of the body region, and extending over the n-type region and the first layer along the wall surface, and the gate insulating film is interposed between the third layer and the gate electrode.

3. The nitride semiconductor device according to claim 1, wherein the third layer is formed by changing the property of the second layer.

4. The nitride semiconductor device according to claim 1, wherein the third layer is formed by regrowing the group III nitride semiconductor from the second layer.

5. The nitride semiconductor device according to claim 1, wherein the body electrode is in contact with the body region on an outermost surface parallel to the major growth surface of the nitride semiconductor structure portion.

6. The nitride semiconductor device according to claim 1, wherein the n-type region is formed by ion implantation of an n-type impurity.

7. The nitride semiconductor device according to claim 2, wherein the third layer is formed by changing the property of the second layer.

8. The nitride semiconductor device according to claim 2, wherein the third layer is formed by regrowing the group III nitride semiconductor from the second layer.

9. The nitride semiconductor device according to claim 2, wherein the body electrode is in contact with the body region on an outermost surface parallel to the major growth surface of the nitride semiconductor structure portion.

10. The nitride semiconductor device according to claim 2, wherein the n-type region is formed by ion implantation of an n-type impurity.

* * * * *